US009887473B2

(12) United States Patent
Lee et al.

(10) Patent No.: US 9,887,473 B2
(45) Date of Patent: Feb. 6, 2018

(54) BOARD CONNECTOR ASSEMBLY, RECEPTACLE CONNECTOR AND PLUG CONNECTOR THEREOF

(71) Applicant: ADVANCED-CONNECTEK INC., New Taipei (TW)

(72) Inventors: Kuo-Ching Lee, New Taipei (TW); Ta-Teh Meng, New Taipei (TW); Mei Shi, New Taipei (TW); Wen-Liang Men, New Taipei (TW); Sheng-Ho Yang, New Taipei (TW); Cheng-Feng Yu, New Taipei (TW)

(73) Assignee: Advanced-Connectek Inc., New Taipei (TW)

( * ) Notice: Subject to any disclaimer, the term of this patent is extended or adjusted under 35 U.S.C. 154(b) by 0 days.

(21) Appl. No.: 15/201,785

(22) Filed: Jul. 5, 2016

(65) Prior Publication Data

US 2017/0018868 A1 Jan. 19, 2017

(30) Foreign Application Priority Data

Jul. 17, 2015 (CN) .......................... 2015 1 0421189

(51) Int. Cl.
*H01R 12/00* (2006.01)
*H05K 1/00* (2006.01)
*H01R 12/71* (2011.01)

(52) U.S. Cl.
CPC .................................. *H01R 12/716* (2013.01)

(58) Field of Classification Search
CPC ..... H01R 12/716; H01R 13/631; H01R 12/52
USPC ........................................................... 739/74
See application file for complete search history.

(56) References Cited

U.S. PATENT DOCUMENTS 5,876,217 A * 3/1999 Ito .......................... H01R 13/20 439/74
5,885,092 A * 3/1999 Ito ........................ H01R 12/716 439/74
6,464,515 B1 * 10/2002 Wu .................. H01R 13/65802 439/108
7,172,434 B2 * 2/2007 Obikane ................ H01R 24/60 439/570
7,637,783 B2 * 12/2009 Sasaoka ................. H01R 43/16 439/637
7,766,666 B1 * 8/2010 Chen ...................... H01R 13/20 439/65

(Continued)

FOREIGN PATENT DOCUMENTS

TW 200725986 7/2007
TW I519006 B 1/2016

*Primary Examiner* — Hae Moon Hyeon
(74) *Attorney, Agent, or Firm* — Alan D. Kamrath; Kamrath IP Lawfirm, P.A.

(57) ABSTRACT

A board connector assembly has a receptacle connector and a plug connector. The receptacle connector has a first insulative housing, two sets of first terminals and two first metal reinforcing members mounted respectively on two opposite ends of the first insulative housing. The plug connector is detachably engaged with the receptacle connector and has a second insulative housing, two sets of second terminals and two second metal reinforcing members mounted respectively on two opposite ends of the second insulative housing. The first and second metal reinforcing members enhance structural strength and durability of the receptacle connector and the plug connector.

12 Claims, 10 Drawing Sheets

(56) References Cited

U.S. PATENT DOCUMENTS

| | | | | |
|---|---|---|---|---|
| 8,845,339 | B2 * | 9/2014 | Ono | H01R 12/712 439/74 |
| 9,178,309 | B2 * | 11/2015 | Tanaka | H01R 13/631 |
| 9,318,823 | B2 * | 4/2016 | Lee | H01R 12/7029 |
| 9,350,095 | B2 * | 5/2016 | Arichika | H01R 13/6271 |
| 9,391,398 | B2 * | 7/2016 | Omodachi | H01R 12/707 |
| 9,484,648 | B2 * | 11/2016 | Takenaga | H01R 12/716 |
| 2006/0264074 | A1 * | 11/2006 | Chang | H01R 12/57 439/74 |
| 2007/0020966 | A1 * | 1/2007 | Lee | H01R 12/716 439/74 |
| 2015/0079816 | A1 * | 3/2015 | Suzuki | H01R 12/716 439/74 |
| 2015/0140841 | A1 * | 5/2015 | Watanabe | H01R 12/7011 439/74 |

* cited by examiner

BOARD CONNECTOR ASSEMBLY, RECEPTACLE CONNECTOR AND PLUG CONNECTOR THEREOF

BACKGROUND OF THE INVENTION

1. Field of the Invention

The present invention relates to a board connector assembly and, more particularly, to a board connector assembly that has a receptacle connector and a plug connector. Each of the receptacle connector and the plug connector has an insulative housing and a metal reinforcing member mounted on the insulative housing to prevent the insulative housing from being damaged due to repetitive engagements and disengagements between the receptacle connector and the plug connector. Therefore, structural strength and durability of the board connector assembly are improved.

2. Description of Related Art

A board connector assembly is used to connect different circuit boards and has a receptacle connector and a plug connector mounted respectively on the circuit board. By way of the board connector assembly, the circuit boards are electrically connected. Board connector assemblies on portable devices such as smart phones are downsized greatly, such that the structural strength and lifespan of each of the receptacle connectors and plug connectors of the board connector assemblies are lowered.

Taiwan patent application No. 095127280 discloses a board connector assembly that has a receptacle connector and a plug connector. The receptacle connector has a first insulative housing and multiple first terminals mounted on the first insulative housing. The plug connector has a second insulative housing and multiple second terminals mounted on the second insulative housing. However, neither of the first and second insulative housings has any reinforcing elements. After repetitive engagements and disengagements, the receptacle connector and the plug connector are easily ruptured and damaged.

Taiwan patent application No. 102145411 discloses a board connector assembly that has a first insulative housing and multiple first terminals mounted on the first insulative housing. The plug connector has a second insulative housing and multiple second terminals mounted on the second insulative housing. Furthermore, both the receptacle connector and plug connector have guiding members to ensure the two connectors are engaged with each other precisely and correctly. However, neither of the receptacle connector and the plug connector has any reinforcing elements, such that the board connector assembly is ruptured easily after repetitive engagements and disengagements of the receptacle connector and the plug connector.

To overcome the shortcomings, the present invention provides a board connector assembly, a receptacle connector and a plug connector thereof to mitigate or obviate the aforementioned problems.

SUMMARY OF THE INVENTION

The main objective of the invention is to provide a board connector assembly that has a receptacle connector and a plug connector. Each of the receptacle connector and the plug connector has an insulative housing and a metal reinforcing member mounted on the insulative housing to prevent the insulative housing from being damaged due to repetitive engagements and disengagements between the receptacle connector and the plug connector. Therefore, structural strength and durability of the board connector assembly are improved.

A board connector assembly in accordance with the present invention comprises a receptacle connector and a plug connector. The receptacle connector has a first insulative housing, two sets of first terminals and two first metal reinforcing members mounted respectively on two opposite ends of the first insulative housing. The plug connector is detachably engaged with the receptacle connector and has a second insulative housing, two sets of second terminals and two second metal reinforcing members mounted respectively on two opposite ends of the second insulative housing. The first and second metal reinforcing members enhance structural strength and durability of the receptacle connector and the plug connector.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
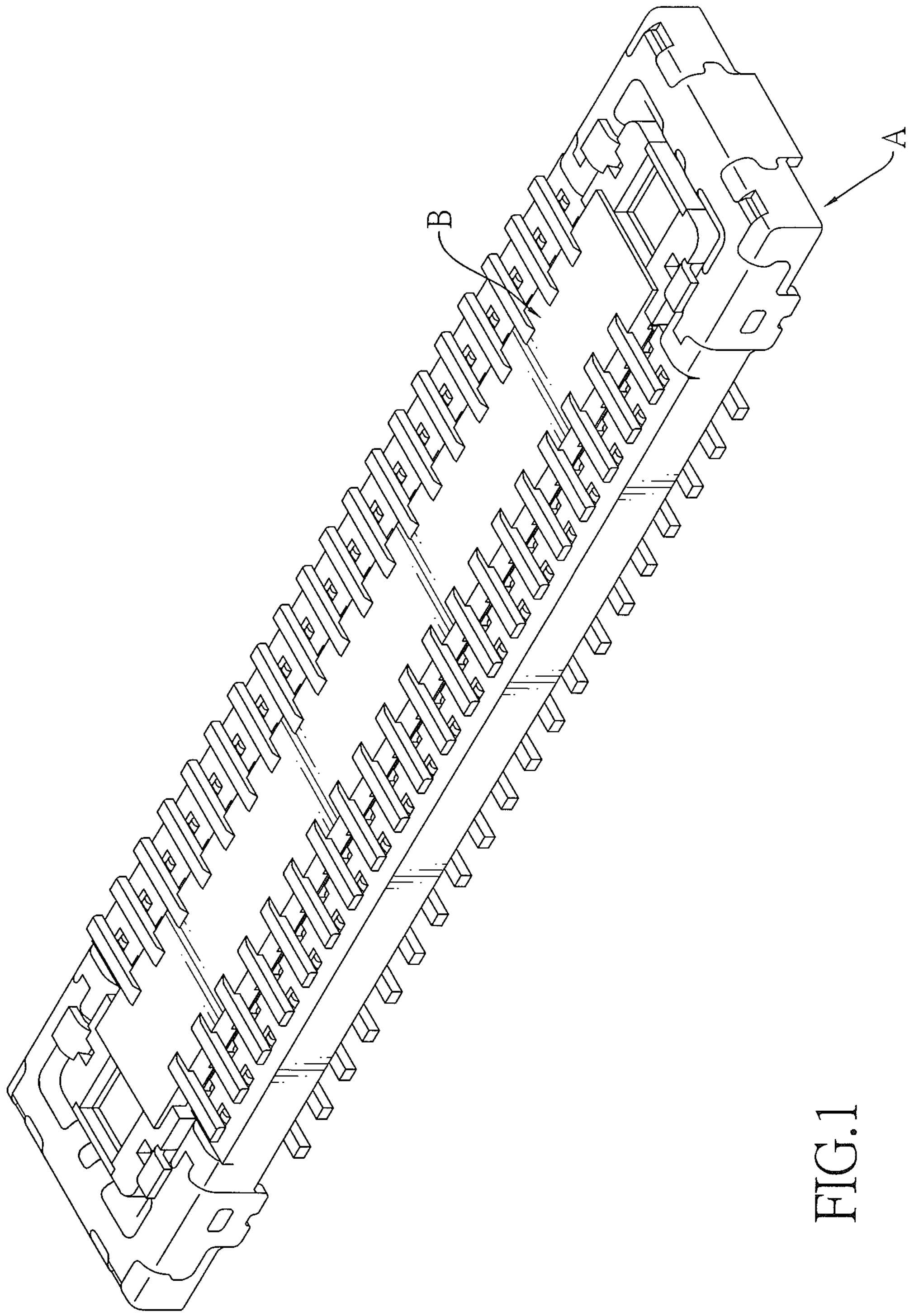
FIG. 1 is a perspective view of a board connector assembly in accordance with the present invention.
Figure 2:
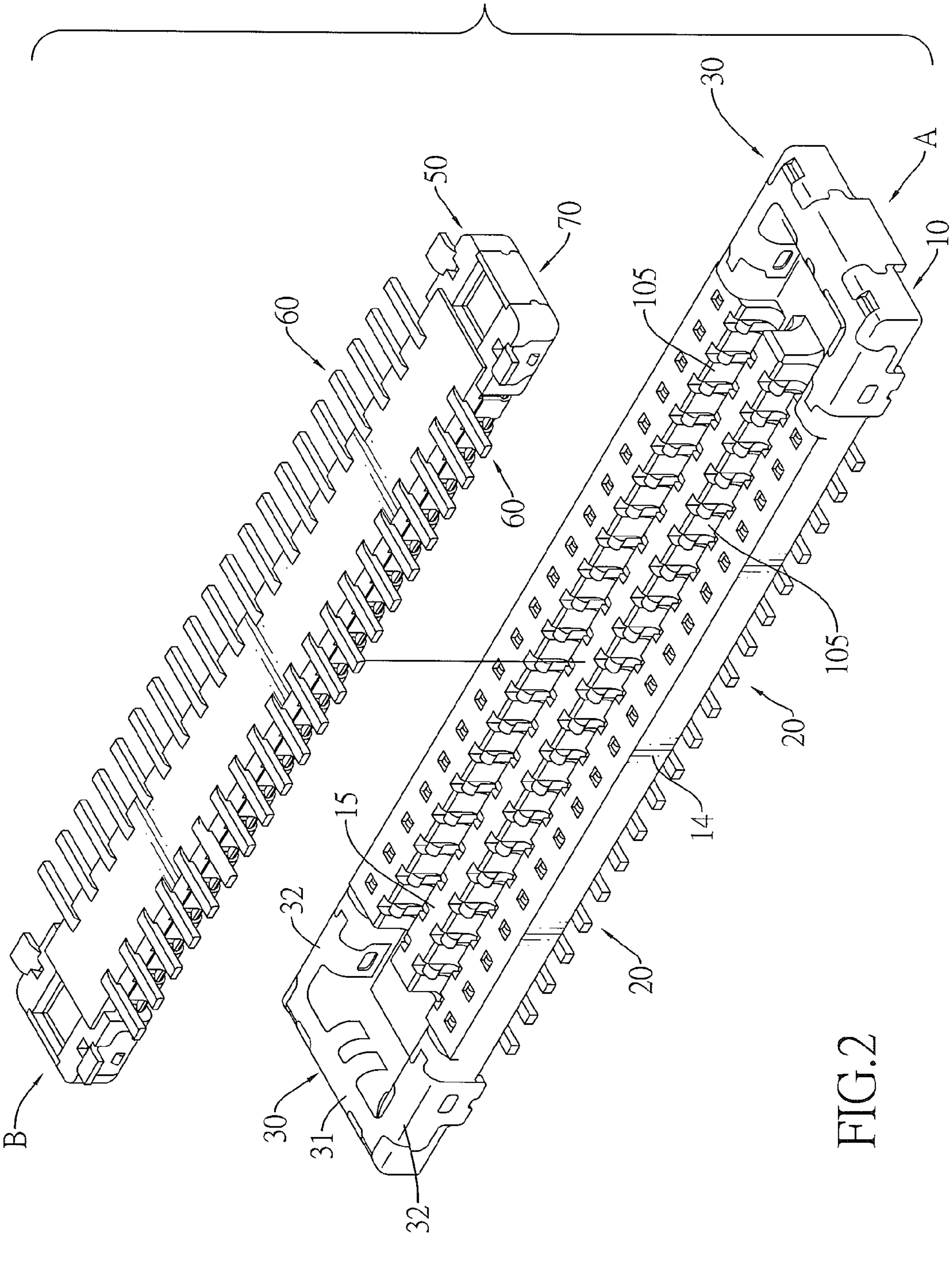
FIG. 2 is an exploded perspective view of the board connector assembly in FIG. 1.

With reference to FIGS. 1 and 2, a board connector assembly in accordance with the present invention comprises a receptacle connector A and a plug connector B.

Figure 3:
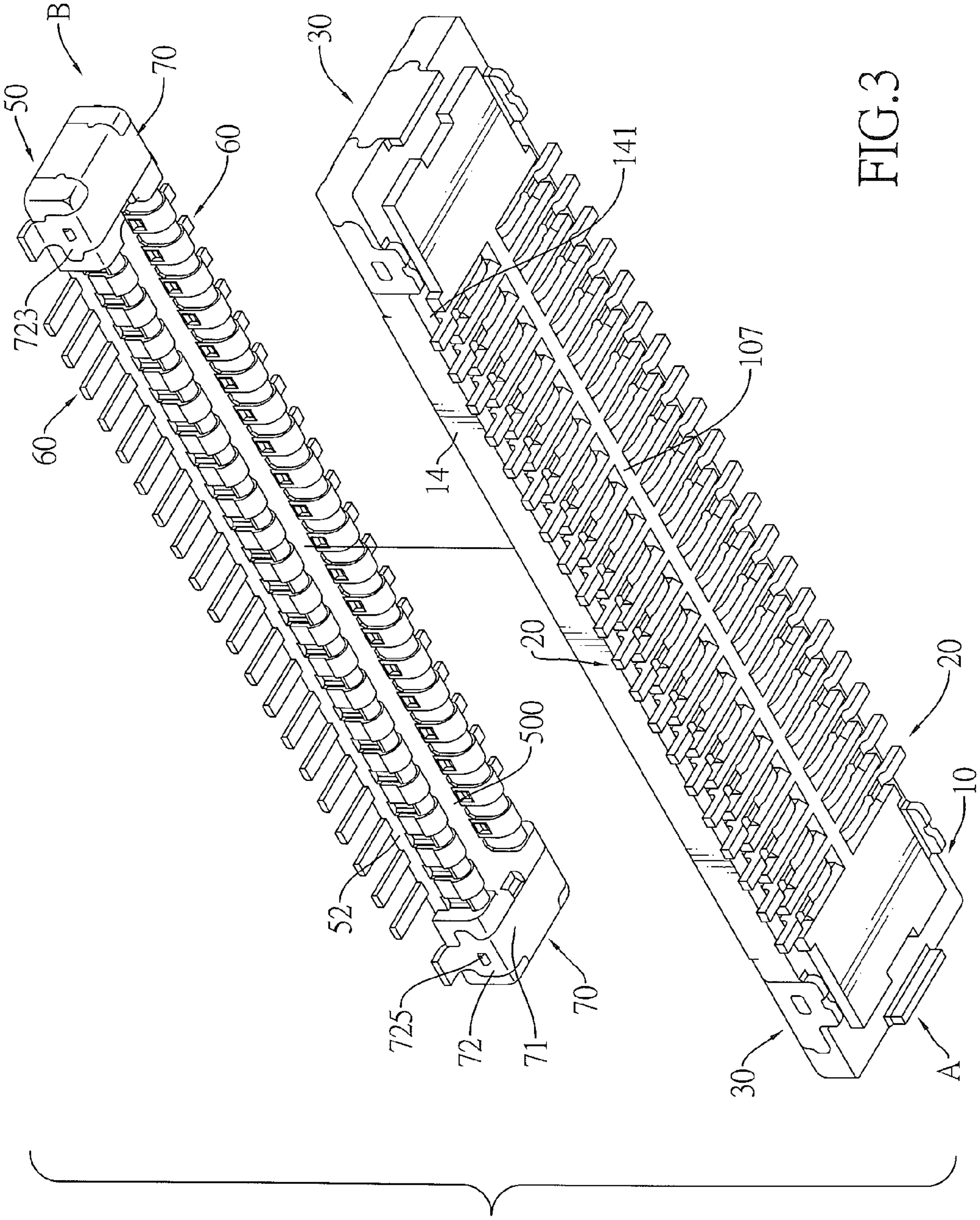
FIG. 3 is another perspective view of the board connector assembly in FIG. 1.
Figure 4:
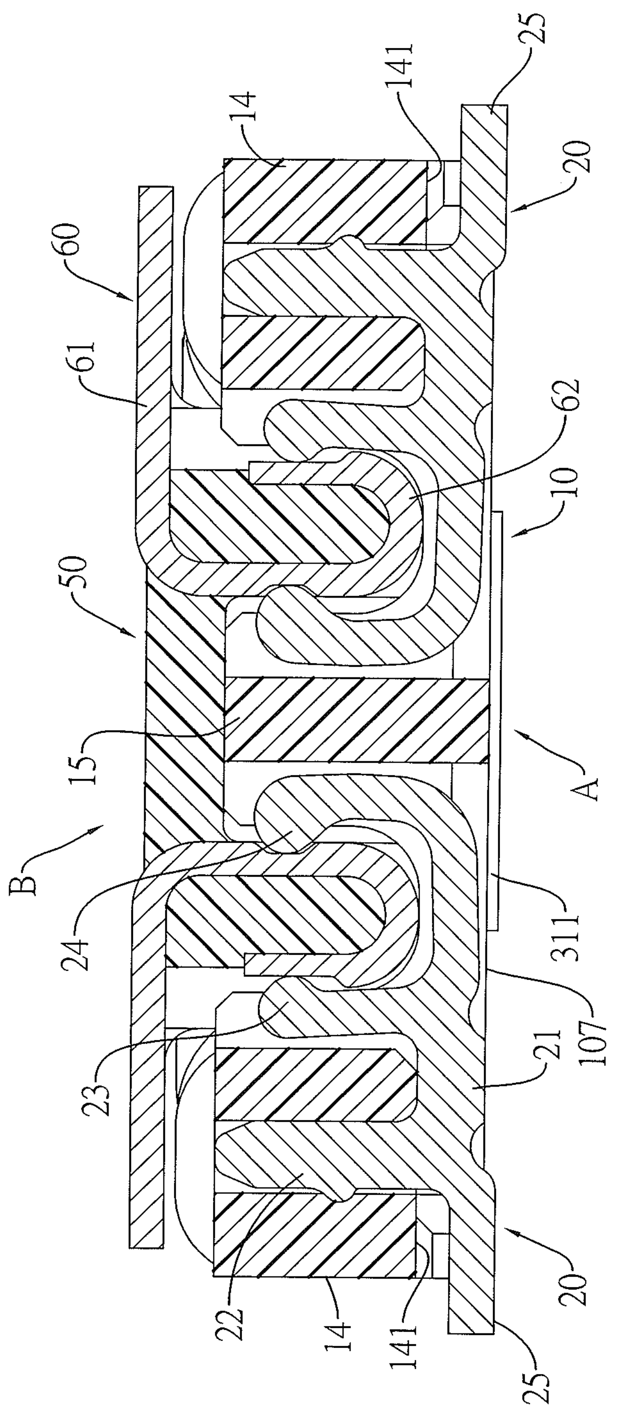
FIG. 4 is a cross sectional end view of the board connector assembly in FIG. 1.
Figure 5:
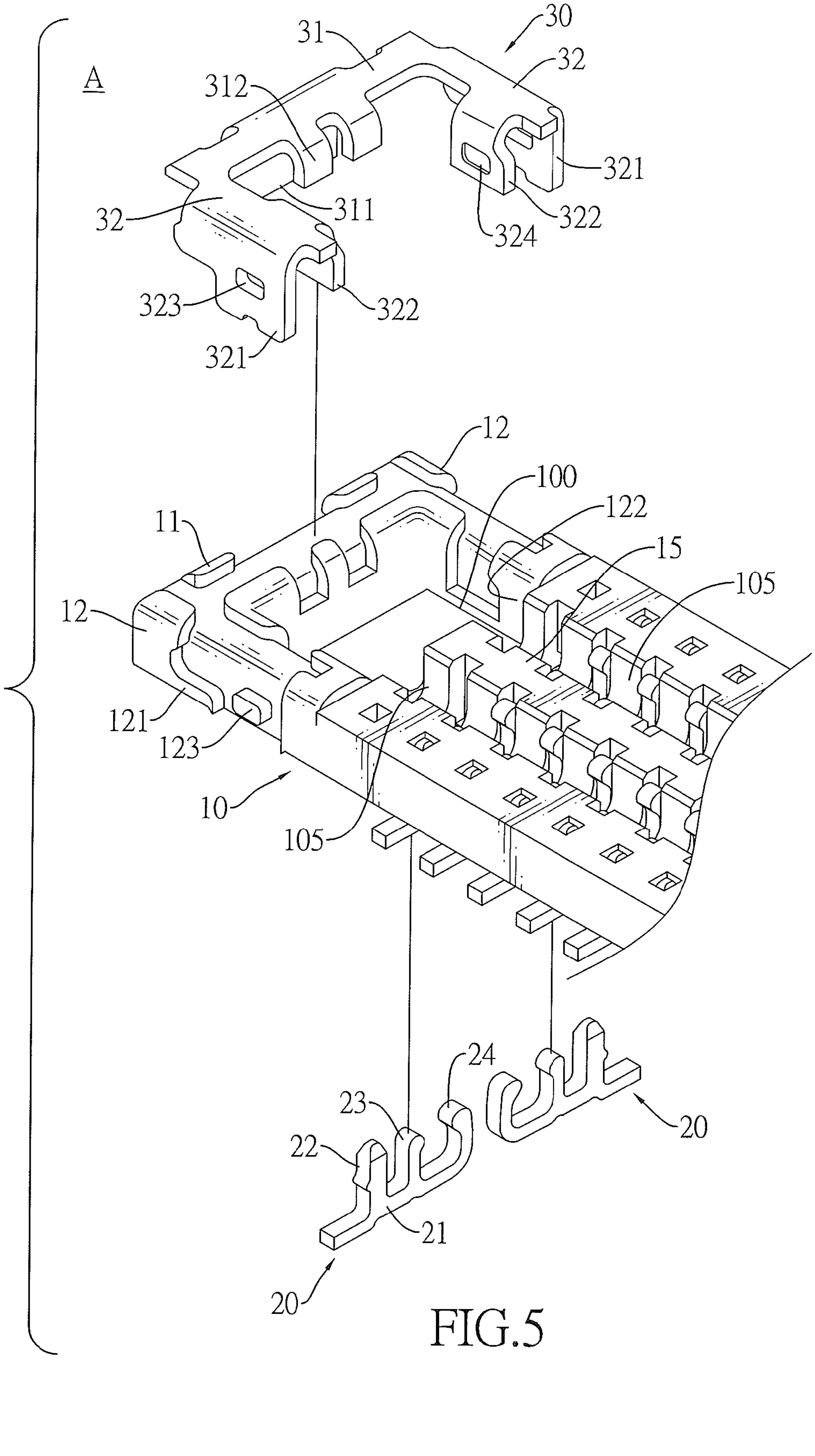
FIG. 5 is an enlarged and exploded perspective view of a receptacle connector of the board connector assembly in FIG. 1.
Figure 6:
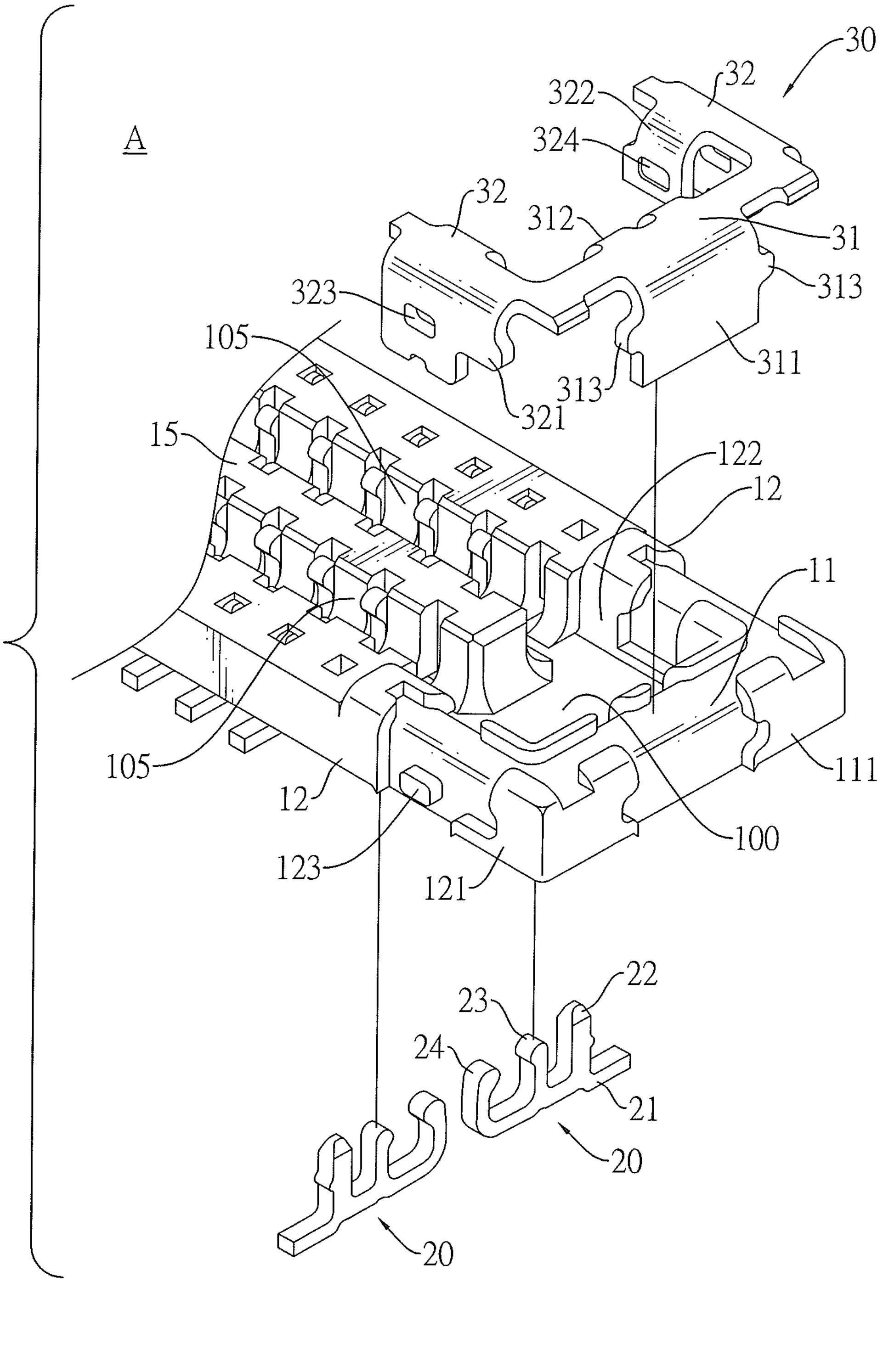
FIG. 6 is another enlarged and exploded perspective view of the receptacle connector of the board connector assembly in FIG. 5.
Figure 7:
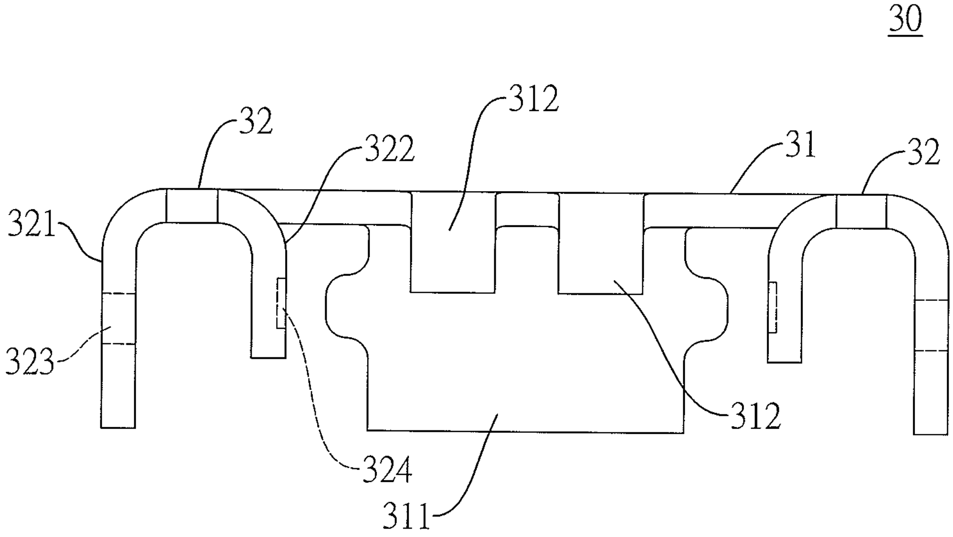
FIG. 7 is an end view of a first metal reinforcing member of the receptacle connector of the board connector assembly in FIG. 5.
Figure 8:
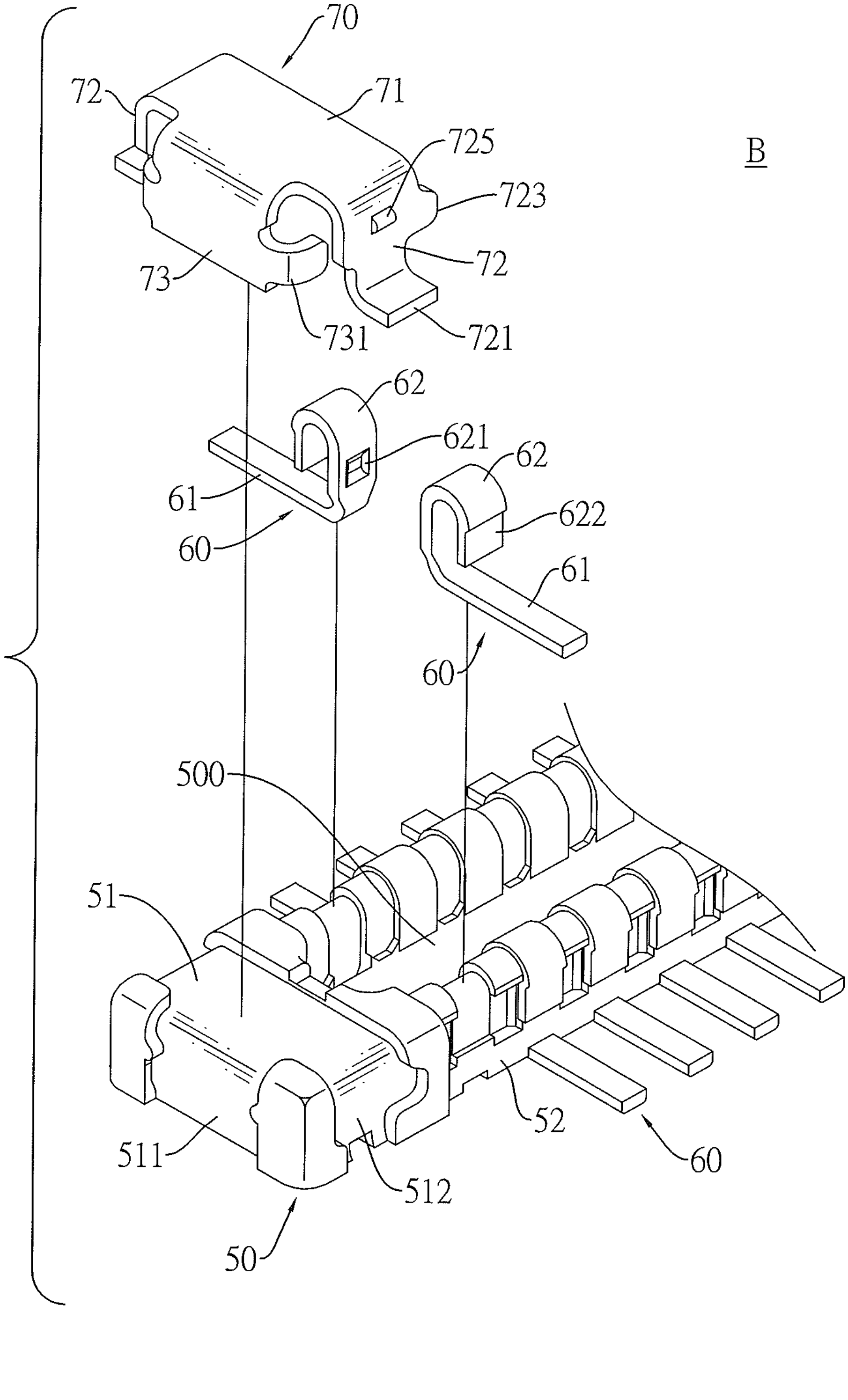
FIG. 8 is an enlarged and exploded perspective view of a plug connector of the board connector assembly in FIG. 1.
Figure 9:
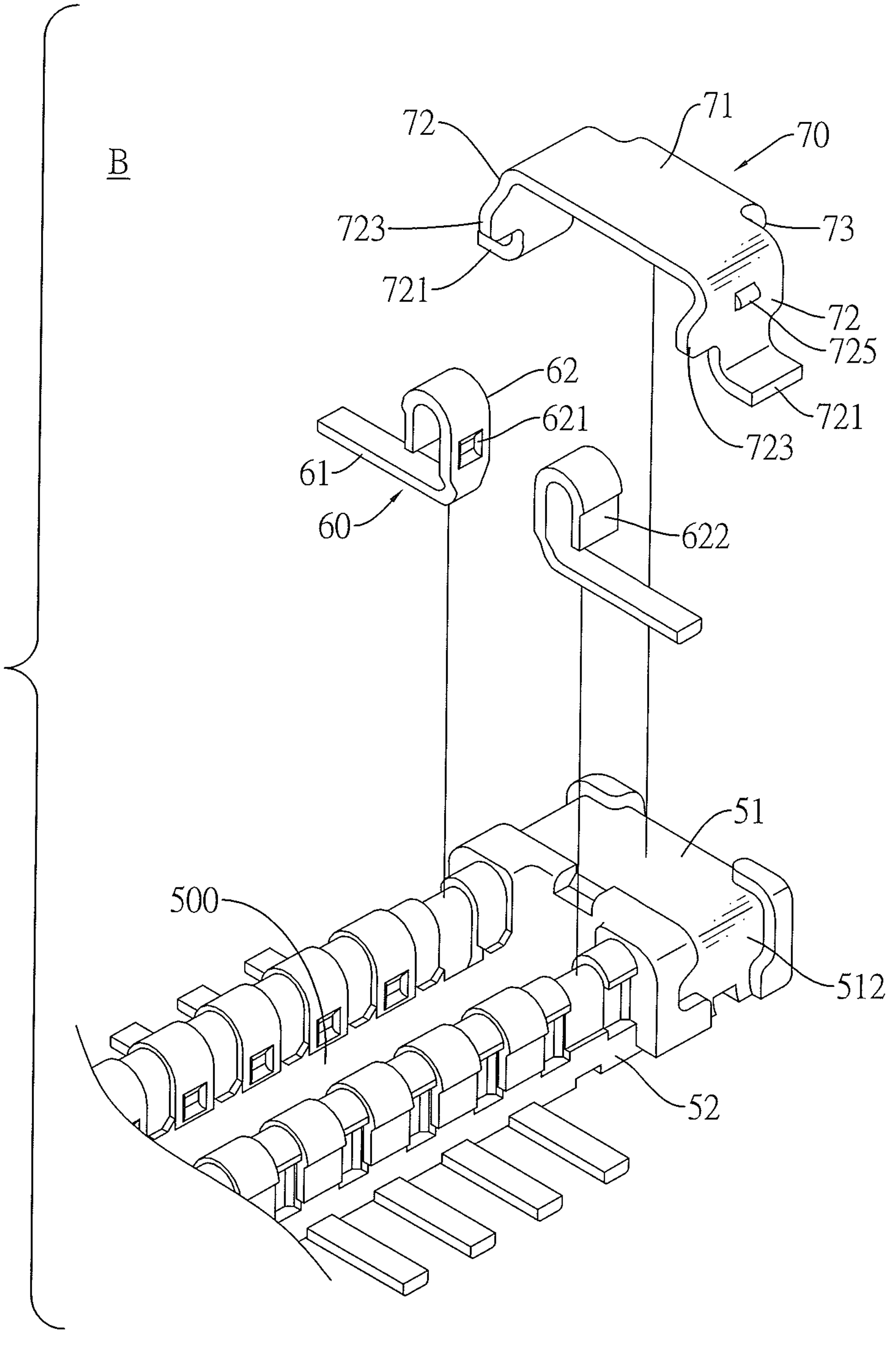
FIG. 9 is another enlarged and exploded perspective view of the plug connector of the board connector assembly in FIG. 8.
Figure 10:
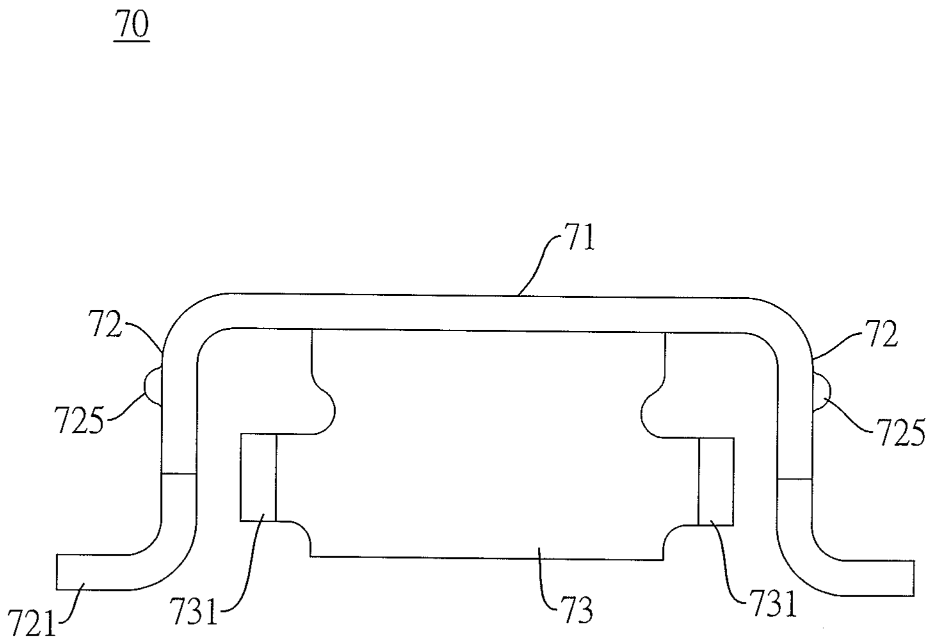
FIG. 10 is an end view of a second metal reinforcing member of the plug connector of the board connector assembly in FIG. 8.

With further reference to FIGS. 3 and 4, the receptacle connector A comprises a first insulative housing 10, two sets of multiple first terminals 20 and two first metal reinforcing members 30.

The first insulative housing 10 has a cavity 100, an assembling ridge 15, two end mounting portions and two airflow slots 141.

The cavity 100 is defined in the first insulative housing 10 and has two opposite mounting slots 105 defined in the cavity 100.

The assembling ridge 15 is formed on and protrudes from an inner surface of the cavity 100 and is located between the mounting slots 105.

The end mounting portions are formed respectively on two opposite ends of the first insulative housing 10, and each end mounting portion is U-shaped and has an end mounting section 11 and two side sections 12. The side sections 12 are connected to the end mounting section 11, and each side section 12 has a mounting protrusion 123 formed on an outer surface of the side section 12.

Each airflow slot 141 is formed between one of two opposite sides 14 and a bottom 107 of the first insulative housing 10.

The sets of the first terminals 20 correspond to and are mounted oppositely and respectively in the mounting slots 105 of the first insulative housing 10. Each first terminal 20 has a first mounting section 21, an embedding section 22, two opposite resilient hooks 23, 24 and a first soldering section 25.

The first mounting section 21 is mounted on the bottom 107 of the first insulative housing 10 and is located under one of the airflow slots 141.

The embedding section 22 is formed on and protrudes from the first mounting section 21 and is embedded in the first insulative housing 10.

The resilient hooks 23, 24 are formed on and protrude from the first mounting section 21 and are mounted in a corresponding mounting slot 105 of the first insulative housing 10.

The first soldering section 25 is formed on and protrudes from the first mounting section 21 and extends out of the first insulative housing 10. Furthermore, the first soldering section 25 protrudes from the bottom 107 of the first insulative housing 10 instead of being flush with the bottom 107.

The first metal reinforcing members 30 correspond to and are mounted respectively on the end mounting portions of the first insulative housing 10, and each first metal reinforcing member 30 has a central section 31 and two opposite extension sections 32.

The central section 31 is mounted on the end mounting section 11 of a corresponding end mounting portion and has an outside end clamping tab 311 and at least one inside end clamping tab 312. The outside end clamping tab 311 is formed on and protrudes from the central section 31, is embedded on an outer wall 111 of the end mounting section 11 and has two positioning protrusions 313 formed on and protruding from two opposite sides of the outside end clamping tab 311 and embedded in the outer wall 111 of the end mounting section 11. The at least one inside end clamping tab 312 is formed on and protrudes from the central section 31, is embedded in an inner wall of the end mounting section 11 and cooperates with the outside end clamping tab 311 to clamp the end mounting section 11.

With further reference to FIGS. 5 to 10, the extension sections 32 are formed on and protrude respectively from two opposite ends of the central section 31 and correspond to and are embedded respectively in the side sections 12 of the corresponding end mounting portion. Each extension section 32 has an outside clamping plate 321 and an inside clamping plate 322. The outside clamping plate 321 is formed on and protrudes from the extension sections 32, is embedded in an outside wall 121 of a corresponding side section 12 and has a through hole 323 defined through the outside clamping plate 321 and mounted around the mounting protrusion 123 of the corresponding side section 12. The inside clamping plate 322 is formed on and protrudes from the extension section 32, is embedded in an inside wall 122 of the corresponding side section 12 and has a positioning notch 324 defined in the inside clamping plate 322.

The plug connector B is engaged detachably with the receptacle connector A and comprises a second insulative housing 50, two sets of multiple second terminals 60 and two second metal reinforcing members 70.

The second insulative housing 50 is engaged detachably with the first insulative housing 10 and has two mounting ribs 52, an assembling slot 500 and two end assembling portions 51.

The mounting ribs 52 are formed on the second insulative housing 50 and are mounted detachably and respectively in the mounting slots 105 of the first insulative housing 10.

The assembling slot 500 is defined between the mounting ribs 52 and detachably receives the assembling ridge 15.

The end assembling portions 51 are formed respectively on two opposite ends of the second insulative housing 50, and each end assembling portion 51 has an outer end wall 511 and two outer side walls 512.

The sets of the second terminals 60 correspond to and are mounted respectively on the mounting ribs 52 of the second insulative housing 50. The second terminals 60 correspond to and are engaged respectively with the first terminals 20, and each second terminal 60 has a second soldering section 61 and a resilient arm 62.

The second soldering section 61 extends out of a corresponding mounting rib 52.

The resilient arm 62 is U-shaped, is formed on and protrudes from the second soldering section 61, is mounted on the corresponding mounting rib 52, is engaged detachably with the resilient hooks 23, 24 of a corresponding first terminal 20, and has a hooking recess 621 and a notched surface 622. The hooking recess 621 is defined in the resilient arm 62 and is engaged with one of the two resilient hooks 23, 24 of the corresponding first terminal 20. The notched surface 622 is defined in the resilient arm 62 opposite the hooking recess 621 and is engaged with the other one of the two resilient hooks 23, 24 of the corresponding first terminal 20.

The second metal reinforcing members 70 correspond to and are embedded respectively in the end assembling portions 51 of the second insulative housing 50 and correspond to the first metal reinforcing members 30, and each second metal reinforcing member 70 has an upper covering plate 71, an end covering plate 73 and two opposite side covering plates 72.

The upper covering plate 71 is embedded in a top of a corresponding end assembling portion 51.

The end covering plate 73 is formed on the upper covering plate 71 and is embedded in the outer end wall 511 of the corresponding end assembling portion 51 and has two thorns 731 formed respectively on two opposite sides of the end covering plate 73 and puncturing into the second insulative housing 50.

The side covering plates 72 are formed on the upper covering plate 71, are embedded respectively in the outer side walls 512 of the corresponding end assembling portion 51 and correspond to the inside clamping plates 322 of a corresponding first metal reinforcing member 30. Each side covering plate 72 has a positioning boss 725, an extensive embedding tab 723 and a soldering leg 721. The positioning boss 725 is formed on the side covering plate 72 and is engaged with the positioning notch 324 of a corresponding inside clamping plate 322 of the corresponding first metal reinforcing member 30. The extensive embedding tab 723 is formed on and protrudes from the side covering plate 72 and is embedded in the outer side wall 512 of the corresponding end assembling portion 51. The soldering leg 721 is formed on the side covering plate 72.

The board connector assembly in accordance with the present invention has the following advantages.

1. The first metal reinforcing members 30 three-dimensionally covering the end mounting portions of the first insulative housing 10 and the second metal reinforcing members 70 three-dimensionally covering the end assembling portions 51 of the second insulative housing 50 entirely protect the end mounting portions and the end assembling portions 51. The structural strength and durability of the first and second insulative housings 10, 50 are therefore improved. Thus, the downsized receptacle connector A and plug connector B still maintain sufficient structural strength and are able to bear the pressure along a direction of engagement and disengagement. The board connector assembly allows repetitive plugging and pulling operations without being damaged.

2. The metal composition of the first metal reinforcing members 30 of the receptacle connector A and the second metal reinforcing members 70 of the plug connector B may be changed based on different purposes such as a large power supply over 3 Amp or a signal transmission. The soldering leg 721 of the second metal reinforcing member 70 may be soldered on a circuit board to securely attach the plug connector to the circuit board. The thorns 731 of the second metal reinforcing member 70 securely mount the second metal reinforcing member 70 to the second insulative housing 50 to prevent inadvertent separation.

3. The airflow slots 141 of the first insulative housing 10 of the receptacle connector A and the protruding first soldering sections 25 allow the first terminals 20 to dissipate heat efficiently and prevent solder from climbing along the sides of the first insulative housing 10 due to capillary action. Therefore, heat dissipation and soldering processing are improved.

Even though numerous characteristics and advantages of the present invention have been set forth in the foregoing description, together with details of the structure and function of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A board connector assembly comprising:
a receptacle connector comprising
a first insulative housing having
a cavity defined in the first insulative housing and having two opposite mounting slots defined in the cavity; and
two end mounting portions formed respectively on two opposite ends of the first insulative housing, and each end mounting portion having
an end mounting section; and
two side sections connected to the end mounting section;
two sets of multiple first terminals corresponding to and mounted oppositely and respectively in the mounting slots of the first insulative housing; and
two first metal reinforcing members corresponding to and mounted respectively on the end mounting portions of the first insulative housing and each first metal reinforcing member having
a central section mounted on the end mounting section of a corresponding end mounting portion and having an outside end clamping tab formed on and protruding from the central section and embedded on an outer wall of the end mounting section; and
two opposite extension sections formed on and protruding respectively from two opposite ends of the central section and corresponding to and embedded respectively in the side sections of the corresponding end mounting portion, and each extension section having
an outside clamping plate formed on and protruding from the extension section and embedded in an outside wall of a corresponding side section; and
an inside clamping plate formed on and protruding from the extension section and embedded in an inside wall of the corresponding side section; and
a plug connector engaged detachably with the receptacle connector and comprising
a second insulative housing engaged detachably with the first insulative housing and having
two mounting ribs formed on the second insulative housing and mounted detachably and respectively in the mounting slots of the first insulative housing; and
two end assembling portions formed respectively on two opposite ends of the second insulative housing and each end assembling portion having an outer end wall and two outer side walls;
two sets of second terminals corresponding to and mounted respectively on the mounting ribs of the second insulative housing, corresponding to and engaged respectively with the first terminals; and
two second metal reinforcing members corresponding to and embedded respectively in the end assembling portions of the second insulative housing, corresponding to the first metal reinforcing members, and each second metal reinforcing member having
an upper covering plate embedded in a top of a corresponding end assembling portion;
an end covering plate formed on the upper covering plate and embedded in the outer end wall of the corresponding end assembling portion; and
two opposite side covering plates formed on the upper covering plate and embedded respectively in the outer side walls of the corresponding end assembling portion, wherein each first terminal has
a first mounting section mounted on a bottom of the first insulative housing;
an embedding section formed on and protruding from the first mounting section and embedded in the first insulative housing;
two opposite resilient hooks formed on and protruding from the first mounting section and mounted in a corresponding mounting slot of the first insulative housing; and
a first soldering section formed on and protruding from the first mounting section and extending out of the first insulative housing, wherein
the first insulative housing further has two airflow slots and each airflow slot is formed between one of the two opposite sides and the bottom of the first insulative housing; and
the first mounting section of each first terminal is located under one of the airflow slots.

2. The board connector assembly as claimed in claim 1, wherein the central section of each first metal reinforcing member further has at least one inside end clamping tab formed on and protruding from the central section, embedded in an inner wall of the end mounting section and cooperating with the outside end clamping tab to clamp the end mounting section.

3. The board connector assembly as claimed in claim 2, wherein the outside end clamping tab of the central section of each first metal reinforcing member has two positioning protrusions formed on and protruding from two opposite sides of the outside end clamping tab and embedded in the outer wall of the end mounting section.

4. The board connector assembly as claimed in claim 3, wherein each side section of each end mounting portion of the first insulative housing has a mounting protrusion formed on an outer surface of the side section; and the outside clamping plate of each extension section of the first metal reinforcing member has a through hole defined through the outside clamping plate and mounted around the mounting protrusion of the corresponding side section.

5. The board connector assembly as claimed in claim 4, wherein each inside clamping plate of each first metal reinforcing member has a positioning notch defined in the inside clamping plate; and each side covering plate of each second metal reinforcing member has a positioning boss formed on the side covering plate and engaged with the positioning notch of a corresponding inside clamping plate of the corresponding first metal reinforcing member.

6. The board connector assembly as claimed in claim 5, wherein each side covering plate of each second metal reinforcing member further has an extensive embedding tab formed on and protruding from the side covering plate and embedded in the outer side wall of the corresponding end assembling portion.

7. The board connector assembly as claimed in claim 6, wherein each side covering plate of each second metal reinforcing member further has a soldering leg formed on the side covering plate.

8. The board connector assembly as claimed in claim 7, wherein the end covering plate of each second metal reinforcing member has two thorns formed respectively on two opposite sides of the end covering plate and puncturing into the second insulative housing.

9. The board connector assembly as claimed in claim 8, wherein the first insulative housing further has an assembling ridge formed on and protruding from an inner surface of the cavity and located between the mounting slots.

10. The board connector assembly as claimed in claim 1, wherein the first soldering section of each first terminal protrudes from the bottom of the first insulative housing.

11. The board connector assembly as claimed in claim 1, wherein each second terminal has a second soldering section extending out of a corresponding mounting rib; and a resilient arm being U-shaped, formed on and protruding from the second soldering section, mounted on the corresponding mounting rib, and engaged detachably with the resilient hooks of a corresponding first terminal.

12. The board connector assembly as claimed in claim 11, wherein the resilient arm of each second terminal has a hooking recess defined in the resilient arm and engaged with one of the two resilient hooks of the corresponding first terminal; and a notched surface defined in the resilient arm opposite the hooking recess and engaged with the other one of the two resilient hooks of the corresponding first terminal.

* * * * *